United States Patent [19]

Hurt et al.

[11] Patent Number: 5,604,706

[45] Date of Patent: Feb. 18, 1997

[54] DATA STORAGE MEDIUM FOR STORING DATA AS A POLARIZATION OF A DATA MAGNETIC FIELD AND METHOD AND APPARATUS USING SPIN-POLARIZED ELECTRONS FOR STORING THE DATA ONTO THE DATA STORAGE MEDIUM AND READING THE STORED DATA THEREFROM

[75] Inventors: Thomas D. Hurt, Chantilly, Va.; Scott A. Halpine, Gaithersburg, Md.

[73] Assignee: TeraStore, Inc., College Park, Md.

[21] Appl. No.: 408,784

[22] Filed: Mar. 23, 1995

Related U.S. Application Data

[62] Division of Ser. No. 188,828, Jan. 31, 1994, Pat. No. 5,446,687.

[51] Int. Cl.$^6$ .................................................. G11C 7/00
[52] U.S. Cl. ........................ 365/217; 365/118; 365/121
[58] Field of Search ................................ 365/217, 121, 365/118, 106, 151; 250/306, 307

[56] References Cited

U.S. PATENT DOCUMENTS

| | | | |
|---|---|---|---|
| 2,952,503 | 9/1960 | Becker | 346/74 |
| 3,094,699 | 6/1963 | Supernowicz | 346/74 |
| 3,170,083 | 2/1965 | Newberry | 315/31 |
| 3,573,753 | 4/1971 | Skelly et al. | 340/173 |
| 3,641,510 | 2/1972 | Chen | 340/173 |
| 3,693,003 | 9/1972 | Sigsbee et al. | 313/66 |
| 3,710,352 | 1/1973 | Smith et al. | 340/173 |

(List continued on next page.)

FOREIGN PATENT DOCUMENTS

| | | |
|---|---|---|
| 0186813 | 7/1986 | European Pat. Off. . |
| 210855 | 2/1987 | European Pat. Off. . |
| 0289221 | 11/1988 | European Pat. Off. . |
| 1173533 | 7/1964 | Germany . |
| 3724617 | 1/1988 | Germany . |
| 4008022 | 9/1991 | Germany . |
| 652510 | 11/1985 | Switzerland . |
| 79109894 | 4/1992 | Taiwan . |
| 1426895 | 3/1976 | United Kingdom . |
| 2162008 | 1/1986 | United Kingdom . |
| 2234842 | 2/1991 | United Kingdom . |
| WO88/01424 | 2/1988 | WIPO . |

OTHER PUBLICATIONS

R. Wisendanger, "Spin–Polarized Scanning Tunneling Microscopy Gateway to Imaging and Modification of Surface Spin Configurations at the Atomic Level", vol. 18, No. 1, (1994), pp. 4–14.

(List continued on next page.)

*Primary Examiner*—David C. Nelms
*Assistant Examiner*—F. Niranjan
*Attorney, Agent, or Firm*—Finnegan, Henderson, Farabow, Garrett & Dunner, L.L.P.

[57] ABSTRACT

A data storage medium comprising a substrate and a data storage layer formed on the substrate. The data storage layer comprises a fixed number of atomic layers of a magnetic material which provide the data storage layer with a magnetic anisotropy perpendicular to a surface of the data storage layer. A data magnetic field is created in the data storage layer. The data magnetic field is polarized either in a first direction corresponding to a first data value or in a second direction corresponding to a second data value. Data is stored in the data storage layer by providing a spin-polarized electron having an electron magnetic field with a direction of polarization corresponding to one of the first and the second data values, and directing the spin-polarized electron at the data magnetic field to impart the direction of polarization of the electron magnetic field to the data magnetic field. Data is read from the data storage layer by directing the spin-polarized electron at the data magnetic field and detecting a deflection or attraction of the spin-polarized electron by the data magnetic field. Alternatively, data is read from the data storage layer by directing the spin-polarized electron at the data magnetic field so that the magnetic medium produces a secondary electron and then detecting certain characteristics of the secondary electron.

11 Claims, 6 Drawing Sheets

U.S. PATENT DOCUMENTS

| | | | |
|---|---|---|---|
| 3,750,117 | 7/1973 | Chen et al. | 340/173 |
| 3,760,383 | 8/1973 | Wolfe et al. | 313/83 |
| 4,068,218 | 1/1978 | Likuski | 365/237 |
| 4,122,530 | 11/1978 | Smith et al. | 364/900 |
| 4,324,854 | 4/1982 | Beauchamp et al. | 430/296 |
| 4,412,264 | 10/1993 | Imamura et al. | 360/134 |
| 4,424,580 | 1/1984 | Becker et al. | 365/121 |
| 4,534,016 | 8/1985 | Kirkpatrick et al. | 365/128 |
| 4,748,592 | 5/1988 | Nagao et al. | 365/113 |
| 4,823,177 | 4/1989 | Prinz et al. | 357/27 |
| 4,985,627 | 1/1991 | Gutierrez et al. | 250/306 |
| 5,116,693 | 5/1992 | Liu et al. | 428/694 |
| 5,122,663 | 6/1992 | Chang et al. | 250/310 |
| 5,134,605 | 7/1992 | Goldberg et al. | 369/101 |
| 5,138,174 | 8/1992 | Tang | 250/492 |
| 5,161,147 | 11/1992 | Goldberg et al. | 369/100 |
| 5,161,149 | 11/1992 | Potember et al. | 369/126 |
| 5,166,919 | 11/1992 | Eigler | 369/126 |
| 5,173,873 | 12/1992 | Wu et al. | 365/173 |
| 5,194,881 | 3/1993 | Hirt | 346/158 |
| 5,216,661 | 6/1993 | Potember et al. | 369/126 |
| 5,446,687 | 8/1995 | Hurt et al. | 365/121 |

OTHER PUBLICATIONS

IBM Technical Disclosure Bulletin; "Technology for Detecting Small Magnetic Domains and Beam Addressed Memory Therewith"; Mar. 1978; pp. 4212–4215; vol. 20, No. 10.

IBM Technical Disclosure Bulletin; "Spin–polarized Tunneling Storage Device"; Sep. 1987; p. 1858, vol. 30, No. 4.

Patent Abstracts of Japan; vol. 12, No. 203 (P–715) & JP, A, 63 00444, Hitachi Ltd. Jan. 9, 1988 (see Abstract).

M. W. J. Prins et al.; Spin–Dependent Transmission at Ferromagnet/Semi–Conductor Interfaces; Journal of Magnetism and Magnetic Materials, vol. 121 (1993); pp. 152–155.

Sandip Dhara et al.; Magnetic Properties of Chemical Vapour Deposited Cobalt Doped Gamma Iron Oxide Thin Films; Jpn. J. Appl. Phys., vol. 31 (1992) Pt. 1, No. 12A; pp. 3853–3857.

R. Allenspach; Ultrathin Films; Magnetism on the Microscopic Scale; Journal of Magnetism and Magnetic Matterials 129 (1994); pp. 160–185.

S. Andrieu et al.; FeIr(001) Superlattices: Growth, Structure, and Magnetic Properties; Journal of Magnetism and Magnetic Materials, vol. 121 (1993) pp. 30–33.

T. H. P. Chang et al.; A scanning Tunneling Microscope Controlled Field Emission Microprobe System; J. Vac. Sci. Technol. B9(2); Mar./Apr. 1991; pp. 438–443.

T. H. P. Chang et al.; Microminiaturization of Electron Optical Systems; J. Vac. Sci. Technol. B8(6); Nov./Dec. 1990, pp. 1698–1703.

Yasutaro Uesaka et al; Micromagnetic Computation of Damping Constant Effect on Switching Mechanism of a Hexagonal Platelet Particle; Jpn J. Appl. Physics; vol. 32 (1993) Pt., No. 3A; pp. 1101–1106.

C. Rau et al.; Layer–Dependent Magnetic Properties at Fe Surfaces Using Spin–Polarized Electron Emission Spectroscopy (SPEES); Journal of Magnetism and Magnetic Materials 121 (1993) pp. 163–166.

W. S. Meisburger et al.; Low–Voltage Electon–Optical System for the High–Speed Inspection of Integrated Circuits; J. Vac. Sci. Technol. B10(6); Nov./Dec. 1992; pp. 2804–2808.

H. Itoh et al; Cell Projection Column for High Speed Electon–Beam Lithography System; J. Vac. Sci. Technol. B10(6); Nov./Dec. 1992; pp. 2799–2803.

Y. Takahashi et al.; Electon Beam Lighography System With New Correction Techniques; J. Vac. Sci. Technol. B10(6); Nov./Dec. 1992; pp. 2794–2798.

M. A. McCord et al.; 100 kV Thermal Field Emission Electron Bean Lithograph Tool for High–Resolution X–ray Mask Pattern; J. Vac. Sci. Technol. B10(6); Nov./Dec. 1992; pp. 2764–2770.

Y. Sakitani et al.; Electon–Beam Cell–Projection Lithography System; J. Vac. Sci. Technol. B10(6); Nov./Dec. 1992; pp. 2759–2763.

Sun–Chul Shin; Co–Based Multilayer Films as Novel Magneto–Optical Recording Media; Aplied Surface Science 65/66 (1993); pp. 110–117.

D. A. Crewe et al.; Micromachined Electrostatic Electron Source; J. Vac. Sci. Technol. B10(6); Nov./Dec. 1992; pp. 2754–2758.

F. Abboud et al.; Electon Beam Lighography Using MEBES IV; J. Vac. Sci. Technol. B10(6); Nov./Dec. 1992; pp. 2734–2742.

Tadashi Yogi et al.; Ultra High Density Media: Gigabit and Beyond; IEEE Transaction on Magnetics; vol. 29, No.1; Jan. 1993; pp. 307–316.

Y. Uesaka et al.; Computer Simulation of Switching Fields and Magnetization States of Interacting Cubic Particles: Cases with Fields Applied Parallel to the Hard Axes; Journal of Magnetism and Magnetic Materials 123 (1993); pp. 337–358.

Jiye Ximen et al.; Electron Optical Properties and aberrations of a Miniaturized Electron Beam System; J. Vac. Sci. Technol. vol. 10, No. 3; May/Jun. 1992; pp. 1197–1202.

Mark Johnson; Biopolar Spin Switch; Science, vol. 260; Apr. 16, 1993; pp. 320–323.

T. H. P. Chang et al.; Arrayed Miniature Electron Beam Columns For High Throughput Sub–100 NM Lithography; J. Vac. Sci. Techol. B, vol. 10, No. 6; Nov./Dec. 1992; pp. 2743–2749.

L. P. Muray et al; Performance Measurements of a 1–keV Electron–Beam Microcolumn; J. Vac. Sci. Technol. B, vol. 10, No. 6; Nov./Dec. 1992; pp. 2749–2753.

DATA STORAGE MEDIUM FOR STORING DATA AS A POLARIZATION OF A DATA MAGNETIC FIELD AND METHOD AND APPARATUS USING SPIN-POLARIZED ELECTRONS FOR STORING THE DATA ONTO THE DATA STORAGE MEDIUM AND READING THE STORED DATA THEREFROM

This is a divisional application of Ser. No. 08/188,828, filed Jan. 31, 1994, now U.S. Pat. No. 5,446,687.

BACKGROUND OF THE INVENTION

1. Field of the Invention

The present invention relates to data storage and retrieval. More particularly, the present invention relates to a data storage medium and a method and apparatus for storing data onto the data storage medium and reading the stored data therefrom.

2. Description of the Related Art

Over the years, there has been an increasing need for high speed mass data storage devices. With the conversion from analog systems to digital systems and the increasing speed of processing demonstrated by the Pentium, PoserPC, Sparc, and other RISC processors, the ability to quickly access large amounts of data is lagging behind demand. This is especially true in the scientific world for computer modeling and simulations, as well as in the consumer world for high definition television (HDTV), HDTV video records, compact disks, personal digital assistants (PDAs), personal communication assistants (PCAs), digital tape decks, and even such items as automobiles. Furthermore, the merging worlds of computers, multimedia, and communication will impact consumers through virtual reality, interactive television, voice recognition systems (vocally interactive), handwriting recognition systems, and integrated communications with entertainment systems, each of which will require high speed static mass data storage.

Applying conventional lithographic techniques and incremental improvement processes to current memory technologies has resulted in incremental progress. This incremental progress will simply increase the disparity between the increasing speed of processors and their capability to store and effectively utilize needed amounts of data.

SUMMARY OF THE INVENTION

Accordingly, the present invention is directed to a data storage medium and a method and apparatus for storing data onto the data storage medium and reading the stored data therefrom that substantially obviate one or more of the problems due to the limitations and disadvantages of the related art.

Features and advantages of the invention will be set forth in the description which follows, and in part will be apparent from the description, or may be learned by practice of the invention. The objectives and other advantages of the invention will be realized and attained by the method and apparatus particularly pointed out in the written description and claims thereof as well as the appended drawings.

To achieve these and other advantages and in accordance with the purpose of the invention, as embodied and broadly described, in a first aspect, the invention provides for a data storage medium comprising a substrate; a data storage layer formed on the substrate, the data storage layer including a fixed number of atomic layers of a magnetic material, the fixed number of atomic layers providing the data storage layer with a magnetic anisotropy perpendicular to a surface of the data storage layer; and a data magnetic field created in the data storage layer, the data magnetic field being polarized either in a first direction perpendicular to the surface of the data storage layer and corresponding to a first data value or in a second direction opposite the first direction and corresponding to a second data value.

In a second aspect, the invention provides for a method of storing data as a direction of polarization of a data magnetic field comprising the steps of providing a spin-polarized electron having an electron magnetic field, the electron magnetic field having a direction of polarization corresponding to one of first and second data values; and directing the spin-polarized electron through an electrically nonconductive environment at the data magnetic field to impart the direction of polarization of the electron magnetic field to the data magnetic field.

In a third aspect, the invention provides for a method of reading data stored as a direction of polarization of a data magnetic field comprising the steps of providing a spin-polarized electron having an electron magnetic field, the electron magnetic field having a direction of polarization corresponding to one of first and second data values; directing the spin-polarized electron at the data magnetic field; detecting, as the first data value, a deflection of the spin-polarized electron by the data magnetic field when the direction of polarization of the data magnetic field is opposite the direction of polarization of the electron magnetic field; and detecting, as the second data value; an attraction of the spin-polarized electron by the data magnetic field when the direction of polarization of the data magnetic field is the same as the direction of polarization of the electron magnetic field.

In a fourth aspect, the invention provides for a method of reading data stored as a direction of polarization of a data magnetic field created in a magnetic medium comprising the steps of providing a spin-polarized electron having an electron magnetic field, the electron magnetic field having a direction of polarization corresponding to one of first and second data values; directing the spin-polarized electron at the data magnetic field so that the magnetic medium produces a secondary electron, the secondary electron having a first characteristic corresponding to the first data value when the direction of polarization of the data magnetic field is opposite the direction of polarization of the electron magnetic field and the secondary electron having a second characteristic corresponding to the second data value when the direction of polarization of the data magnetic field is the same as the direction of polarization of the electron magnetic field; and detecting the first or second characteristic of the secondary electron.

In a fifth aspect, the invention provides for an apparatus for storing data as a direction of polarization of a data magnetic field comprising an electron source for providing a spin-polarized electron having an electron magnetic field, the electron magnetic field having a direction of polarization corresponding to one of first and second data values; and an electron deflector for directing the spin-polarized electron through an electrically nonconductive environment at the data magnetic field to impart the direction of polarization of the electron magnetic field to the data magnetic field.

In a sixth aspect, the invention provides for an apparatus for reading data stored as a direction of polarization of a data magnetic field comprising an electron source for providing a spin-polarized electron having an electron magnetic field, the electron magnetic field having a direction of polarization corresponding to one of first and second data values; an electron deflector for directing the spin-polarized electron at the data magnetic field; and an electron detector for detecting, as the first data value, a deflection of the spin-polarized electron by the data magnetic field when the direction of polarization of the data magnetic field is opposite the direction of polarization of the electron magnetic field and detecting, as the second data value, an attraction of the spin-polarized electron by the data magnetic field when the direction of polarization of the data magnetic field is the same as the direction of polarization of the electron magnetic field.

In a seventh aspect, the invention provides for an apparatus for reading data stored as a direction of polarization of a data magnetic field created in a magnetic medium comprising an electron source for providing a spin-polarized electron having an electron magnetic field, the electron magnetic field having a direction of polarization corresponding to one of first and second data values; an electron deflector for directing the spin-polarized electron at the data magnetic field so that the magnetic medium produces a secondary electron, the secondary electron having a first characteristic corresponding to the first data value when the direction of polarization of the data magnetic field is opposite the direction of polarization of the electron magnetic field and the secondary electron having a second characteristic corresponding to the second data value when the direction of polarization of the data magnetic field is the same as the direction of polarization of the electron magnetic field; and an electron detector for detecting the first or second characteristic of the secondary electron.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate a presently preferred embodiment of the invention and, together with the description, serve to explain the principles of the invention. In the drawings.

DESCRIPTION OF THE PREFERRED EMBODIMENT

Reference will now be made in detail to the present preferred embodiment of the invention, an example of which is illustrated in the accompanying drawings.

Figure 1:
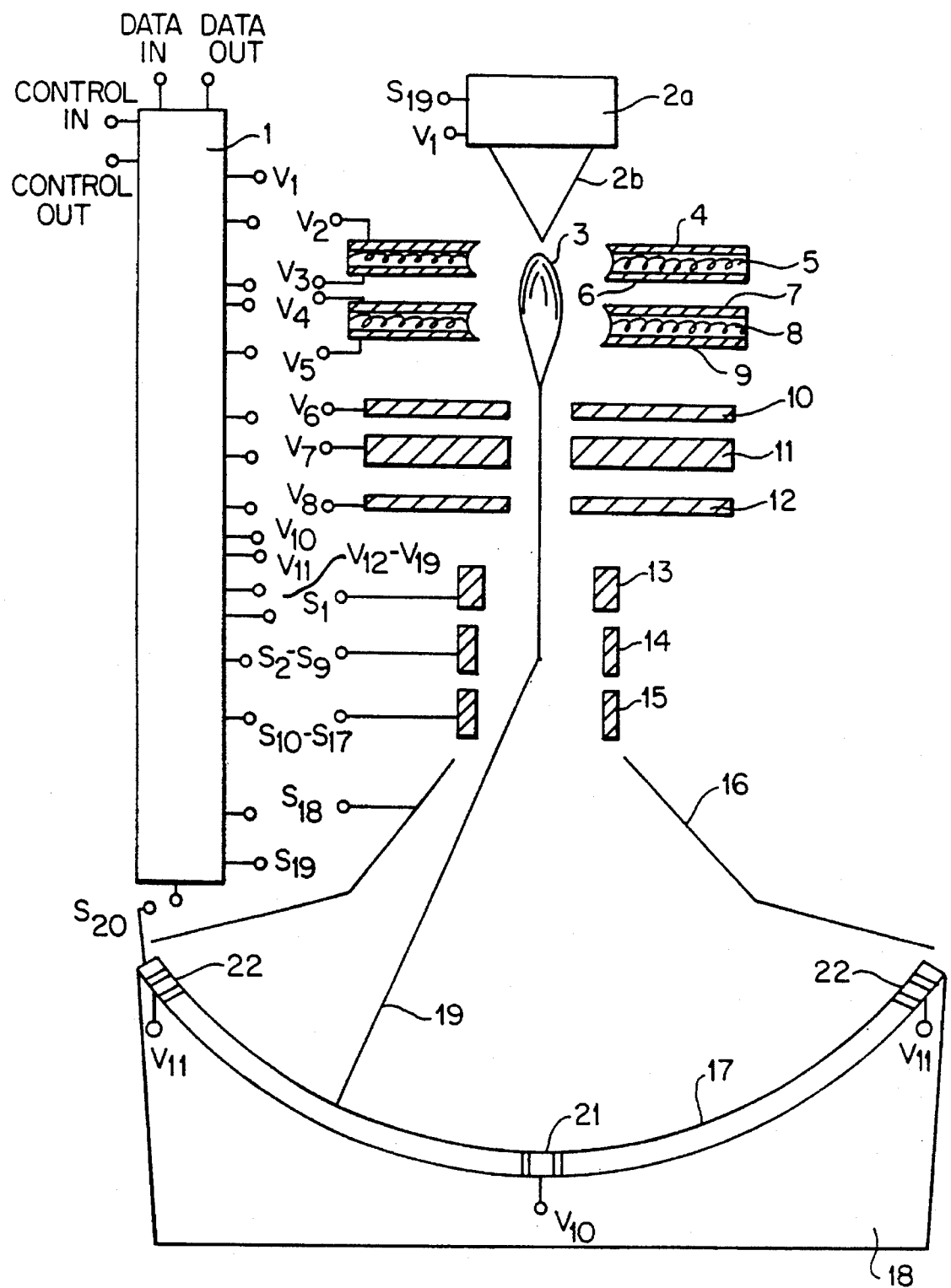
FIG. 1 is a cross-sectional view of an exemplary data storage and retrieval device of the present invention.

FIG. 1 illustrates an exemplary embodiment of a data storage and retrieval device of the present invention. As shown in FIG. 1, the data storage and retrieval device comprises a control unit 1, a spin-polarized electron source 2a, a tip 2b, an extractor 4, collimators 6, 7 and 9, electrostatic lenses 10, 11 and 12, and insulating elements 5 and 8. As also shown in FIG. 1, the data storage and retrieval device further comprises a blanking element 13, coarse and fine microdeflectors 14 and 15, respectively, an electron detector 16, a data storage layer 17, and a substrate 18.

The control unit 1, which comprises, for example, a microprocessor or other control circuitry known in the art, coordinates and sequences the various functions and operations performed by the data storage and retrieval device, as will be explained in more detail below. The control unit 1 further serves to interface the data storage and retrieval device with an external device (not shown), such as a computer or even another data storage and retrieval device, via DATA IN, DATA OUT, CONTROL IN, and CONTROL OUT terminals. By this interfacing, control signals and data from the external device can be transmitted to and decoded by the control unit 1 using necessary protocols. The control unit 1 can develop control responses and data and return the data to the external device using the necessary protocols. It is contemplated that the control unit 1 can be interfaced with the external device via, for example, electrical or optical links. For instance, optical transmission into and out from the control unit 1 can be accomplished using electrically pumped laser diodes.

The spin polarized electron source 2a and the tip 2b together provide spin-polarized electrons 3. In particular, the spin-polarized electrons 3 are developed by the spin polarized electron source 2a and are collected in the tip 2b. The spin-polarized electron source 2a can comprise any source for providing spin-polarized electrons known in the art. The tip 2b can comprise, for example, the tip of a scanning electron microscope or other similar device. Preferably, the tip 2b has a small diameter, such as the diameter of a single atom.

Each of the spin-polarized electrons 3 has an electron magnetic field with a direction of polarization determined by the electron's spin. The direction of polarization of the electron magnetic field corresponds to one of first and second data values. For example, an upwardly polarized electron magnetic field can correspond to a data value of "1" while a downwardly polarized electron magnetic field can correspond to a data value of "0", or vice versa.

A potential $V_1$ is applied to the spin-polarized electron source 2a by the control unit 1. The strength of the potential $V_1$ can be varied by the control unit 1 to control the intensity and current of the spin-polarized electrons 3. A signal $S_{19}$ is also applied to the spin-polarized electron source 2a by the control unit 1. Signal $S_{19}$ controls the direction of polarization of the magnetic fields of the spin-polarized electrons 3. Preferably, the control unit 1 can vary the potential $V_1$ and signal $S_{19}$ during operation of the device to compensate for physical changes in the device and its environment over time.

The extractor 4, collimators 6, 7 and 9, electrostatic lenses 10–12, the blanking element 13, and the coarse and fine microdeflectors 14 and 15, respectively, each constitutes, for example, an electrically conductive annular member defining an aperture. The extractor 4 extracts the spin-polarized electrons 3 from the tip 2b and collimators 6, 7 and 9 collimate the spin-polarized electrons 3 into a spin-polarized electron beam 19. The electrostatic lenses 10–12 focus the spin-polarized electron beam 19 and the coarse and fine microdeflectors 14 and 15, respectively, direct the spin-polarized electron beam 19 toward the data storage layer 17.

The environment through which the spin-polarized electron beam 19 travels is preferably an electrically nonconductive and nonionizing environment such as a vacuum. It is contemplated, however, that the environment through which the spin-polarized electron beam 19 travels can be any number of other environments known in the art which would not degrade, but may enhance, passage of the spin-polarized electron beam 19 from the electron source 2 to the data storage medium 17.

As shown in FIG. 1, the tip 2b is positioned so as to be perpendicular to the plane of the surface of the extractor 4, at the center of the extractor 4 aperture, and juxtaposed at or near the extractor 4 surface. Preferably, the apertures of extractor 4 and collimator 6 are in the order of 1 millimeter in diameter. However, larger or smaller diameters could also be used depending on the particular design of the data storage and retrieval device and the desired characteristics of the spin-polarized electron beam 19.

Insulating element 5 which comprises, for example, Si, or the like, is positioned between the extractor 4 and collimator 6 to separate their conductive surfaces. Preferably, the diameter of the aperture of insulating element 5 is slightly greater than the diameters of the apertures of extractor 4 and collimator 6 to reduce interaction of the insulating element 5 with magnetic fields produced in and electrons passing through the apertures of extractor 4 and collimator 6.

Potentials $V_2$ and $V_3$ are applied by the control unit 1 to the extractor 4 and collimator 6, respectively, to create an electrostatic field in the aperture of each. The position of the tip 2b relative to the electrostatic fields produced in the apertures of extractor 4 and collimator 6 induce the spin-polarized electrons 3 to jump from the tip 2b and pass through the apertures of extractor 4 and collimator 6.

Collimators 7 and 9 and insulating element 8, which can be similar or identical to extractor 4, collimator 6, and insulating element 5, respectively, constitute an optional lens stage to assist in collimating of the spin-polarized electrons 3 into the spin-polarized electron beam 19. Collimators 7 and 9 and insulating element 8 can also be used to accelerate or decelerate the spin-polarized electrons 3 to obtain a desired beam energy.

The potentials $V_2$–$V_5$ can be adjusted by the control unit 1 to obtain desired characteristics of the spin-polarized electrons 3 and the spin-polarized electron beam 19. Control of the potentials $V_2$–$V_5$ can be performed during operation of the device to compensate for physical changes in the device and its environment over time.

After passing through collimator 9, the spin-polarized electron beam 19 passes through electrostatic lenses 10–12. Potentials $V_6$–$V_8$ are applied to the electrostatic lenses 10–12, respectively, by the control unit 1 to create electrostatic fields through the lens apertures. These electrostatic fields focus the spin-polarized electron beam 19 with a desired diameter, e.g., 1–10 nanometers. The apertures of the electrostatic lenses 10–12 are preferably on the order of 1 millimeter in diameter but can be varied depending on the particular design of the data storage and retrieval device and the desired characteristics, e.g., intensity, beam shape, etc., of the spin-polarized electron beam 19. Furthermore, the thicknesses of the electrostatic lenses 10–12, their relative positions, and the potentials $V_6$–$V_8$ can be varied to obtain desired characteristics of the spin-polarized electron beam 19. Again, the potentials $V_6$–$V_8$ can be varied by the control unit 1 during operation of the device to compensate for physical changes in the device and its environment over time. Further, the electrostatic lenses 10–12 can be replaced with fewer or more of such lenses. Also, magnetic lenses can be used in place of, or in addition to, the electrostatic lenses 10–12.

After passing through electrostatic lens 12, the spin-polarized electron beam 19 passes through the blanking element 13. As will be explained in more detail below, the blanking element 13 is an optional element which disables the effects of the spin-polarized electron beam 19. The preferred location of the blanking element 13 is above the coarse microdeflector 14, as shown in FIG. 1, to allow the spin-polarized electron beam 19 to achieve a steady state.

After passing through the blanking element 13, the spin-polarized electron beam 19 passes through the coarse microdeflector 14 and then the fine microdeflector 15. Preferably, the coarse microdeflector 14 comprises eight poles individually controlled by signals $S_2$–$S_9$ supplied by the control unit 1. Similarly, the fine microdeflector 14 also preferably comprises eight poles individually controlled by signals $S_{10}$–$S_{17}$ also supplied by the control unit 1. The coarse and fine microdeflectors 14 and 15, respectively, direct the spin-polarized electron beam 19 toward the data storage layer 17. While the coarse microdeflector 14 bends the trajectory of the spin-polarized electron beam 19 toward a general area on the data storage layer 17, the fine microdeflector 15 further adjusts the trajectory of the spin-polarized electron beam 19 to direct the spin-polarized electron beam 19 at a specific area of the data storage layer 17. By gradually bending the spin-polarized electron beam 19 in this manner, distortions and aberrations introduced into the spin-polarized electron beam 19 can be reduced. It is contemplated that the fine microdeflector 15 can enable positioning of the spin-polarized electron beam 19 to the atomic level on data storage layer 17. Although the coarse and fine microdeflectors 14 and 15, respectively, have been described to comprise eight poles each, it is contemplated that the coarse and fine microdeflectors 14 and 15, respectively, can have other configurations known in the art. Further, the relative positions of the coarse and fine microdeflectors 14 and 15, respectively, and the data storage layer 17 can be determined as a function of X-Y axis scanning range of the spin-polarized electron beam 19.

Figure 2:
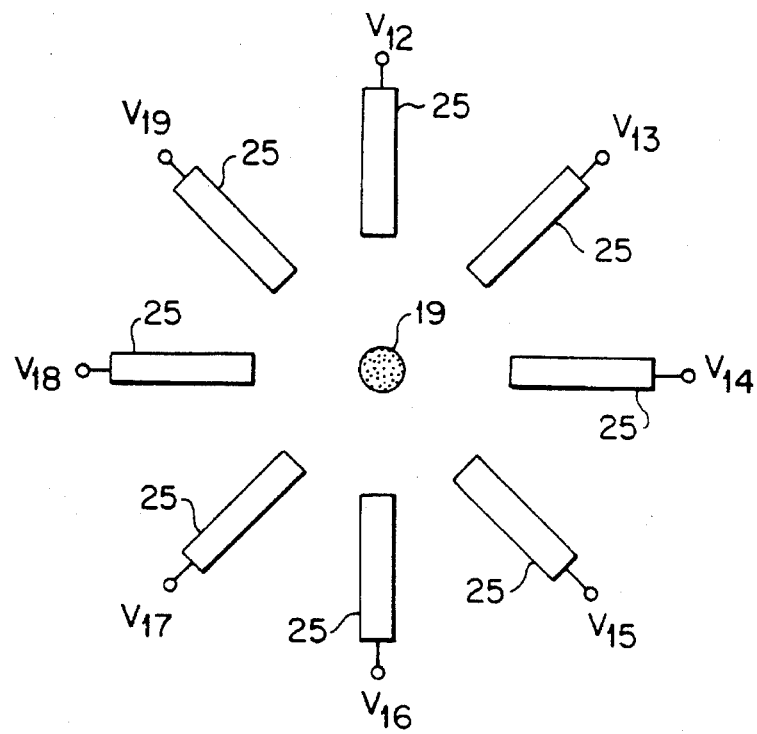
FIG. 2 is plan view of a stigmator element for use in the data storage and retrieval device of FIG. 1.

Although not shown in FIG. 1, the data storage and retrieval device can further comprise a stigmator element such that shown in FIG. 2. Preferably, the stigmator element is positioned either between the electrostatic lens 12 and the blanking element 13 or between the blanking element 13 and the coarse microdeflector 14. As shown in FIG. 2, the stigmator element comprises, for example, eight poles 25 individually biased with potentials $V_{12}$–$V_{19}$. It is contemplated that the stigmator element 25 can have other configurations known in the art. The individual potentials $V_{12}$–$V_{19}$ are applied to the stigmator poles 25 by the control unit 1 and are set during operation of the device to develop a field that results in a desired shape of the spin-polarized electron beam 19 and to compensate for physical changes in the data storage and retrieval device and its environment over time. Although the stigmator element is generally used to provide the spin-polarized electron beam 19 with a round cross-sectional shape, the stigmator element can also be used to provide the spin-polarized electron beam 19 with a cross-sectional shape other than round, e.g. oval.

The electron detector 16 comprises an electrically conductive material, such as a metal, and is configured, for example, as shown in FIG. 1, to optimize the detection of electrons deflected from or secondary electrons emitted by the data storage layer 17. Preferably, the electron detector 16 is positioned so as not to interfere with the path of the spin-polarized electron beam 19 but close enough to the data storage layer 17 to detect the deflected or emitted electrons. Electrons striking the electron detector 16 produce a signal in the electron detector 16 which is supplied to the control unit 1 as signal $S_{18}$.

The data storage layer 17 and the substrate 18 together constitute a data storage medium. Preferably, the data storage layer 17 is deposited on the substrate 18 via, for example, sputtering or other technique known in the art. The substrate 18 comprises a non-magnetic and non-electrically conductive material, such as a glass or ceramic, and serves as a mechanical support for the data storage layer 17.

The data storage layer 17 comprises a fixed number of atomic layers of a magnetic material, wherein the fixed number of atomic layers provides the data storage layer 17 with a magnetic anisotropy perpendicular to its surface, i.e., along its easy axis. For example, in the case where the data storage layer 17 comprises Fe, three atomic layers of Fe arranged in a body centered tetragonal (bct) lattice provide the data storage layer with a strong Z-axis magnetism. Fe begins to shift, however, to a face centered cubic (fcc) lattice at numbers of atomic layers greater than three, which causes the magnetic anisotropy of the Fe atoms to shift to the X-Y plane. Similar results can also be achieved by combining Fe with certain dopants or alloying elements, such as Co or Ni.

The magnetic component of the data storage layer 17 is caused by the spin of the component metal d subshell electrons in the material from which the data storage layer 17 is made. Thus, any multiple-electron metal with higher binding energies of f or s subshell electrons than that for the d subshell and which can be made to exhibit a bct structure in few atomic layers can be used as the data storage layer 17. Candidate metals for the data storage layer 17 can be from the three periodic table transition series. For example, candidate metals from the 3d series can include Co and Ni. Similarly, candidate metals from the 4d and 5d series can include Ir and Mo, respectively. In these metals, electrons fill the next outer f subshell or next outer s subshell before the d subshell of the inner shell is filled. For the 3d series, the s electrons determine chemical properties of the atom while the d electrons determine magnetic properties of the atom. In general, the electrons in the d subshell remain unpaired whenever possible. The first five electrons in the subshell have parallel spins each of which add to the magnetic moment of the atom. Successor electrons must be antiparallel as can be noted by analysis of the fourth quantum number. These antiparallel electrons pair up with the first electrons and cancel their magnetic moments.

Figure 3A:
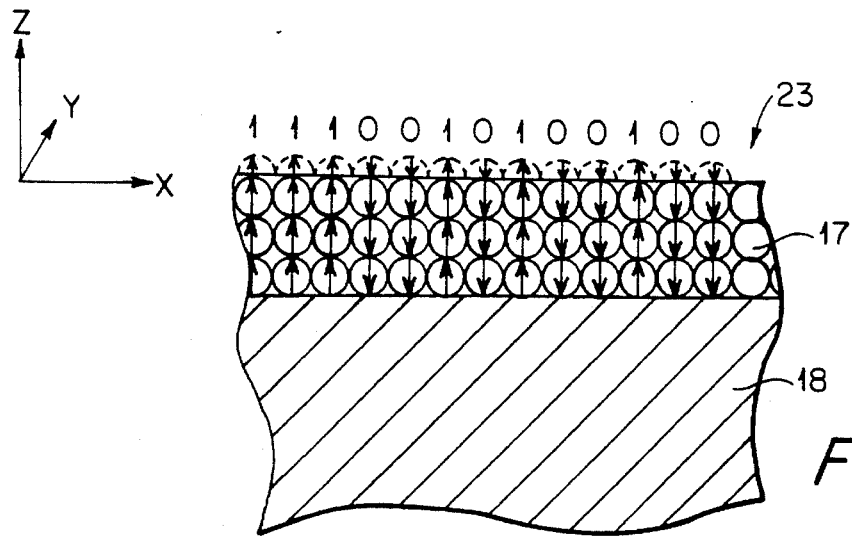
FIGS. 3(a) and 3(b) are partial cross-sectional views of the data storage medium of FIG. 1.

Because of the perpendicular magnetic anisotropy of the data storage layer 17, each lattice of atoms in the data storage layer 17 creates a data magnetic field having a polarization that extends along its easy axis, i.e., perpendicular to the surface of the data storage layer 17. These data magnetic fields are representatively shown in FIG. 3(a) as data magnetic fields 23. Like the magnetic fields produced by the spin polarized electrons 3, each data magnetic field created in the data storage layer 17 has a direction of polarization corresponding to one of first and second data values. For instance, an upwardly polarized data magnetic field can correspond to the data value of "1" while a downwardly polarized data magnetic field can correspond to the data value of "0", or vice versa. With this arrangement, portions of the data storage layer 17 store data in one of two states, i.e., first and second directions of magnetic polarity. It is contemplated that these portions of the data storage layer 17 can be as small as one atom wide.

Figure 4A:
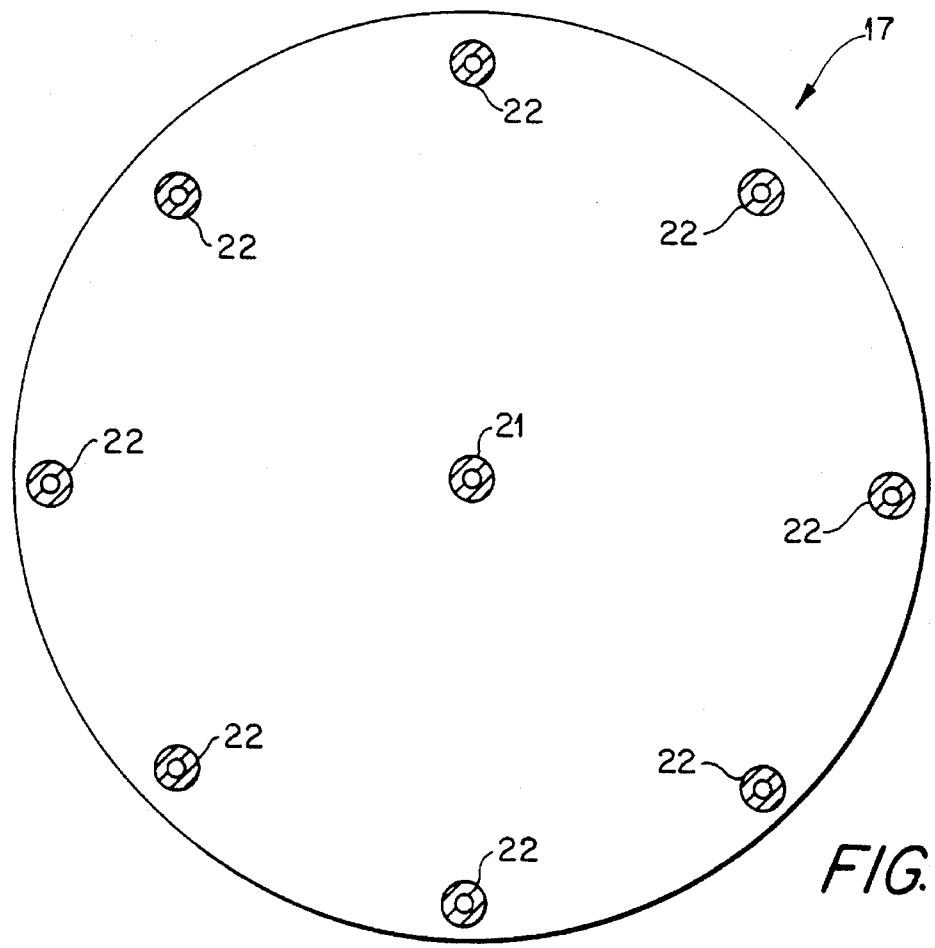
FIG. 4(a) is a plan view of the data storage medium of FIG. 1.
Figure 4B:
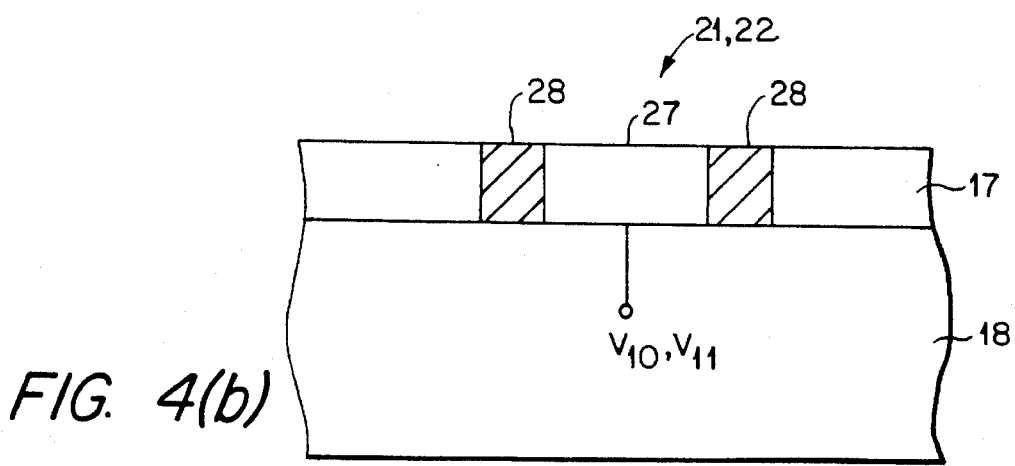
FIG. 4(b) is a partial cross-sectional view of the data storage medium of FIG. 1 showing parking and alignment areas.

As shown in FIGS. 4(a) and 4(b), the data storage layer 4 includes a plurality of alignment areas 22 and a parking area 21. Each of the alignment areas 22 and the parking area 21 comprises an electrically conductive material 27 electrically insulated from the data storage layer 17 by an insulator 28. The alignment areas 22 and parking area 21 are used for performing alignment, parking, and blanking operations, which will be described in more detail below. Potential $V_{10}$ of the parking area 21 and potential $V_{11}$ of the alignment areas 22 are detected by the control unit 1, as shown in FIG. 1.

Preferably, the data storage layer 17 has a three dimensional curved surface, as shown in FIG. 1, to allow all points on the data storage layer 17 to be approximately equidistant from the center of the fine microdeflector 15 aperture, thereby reducing electron travel time and providing a uniform beam depth of focus across the surface of the data storage layer 17. It is contemplated that the data storage medium can have any number of surface shapes including a planar surface.

Figure 5A:
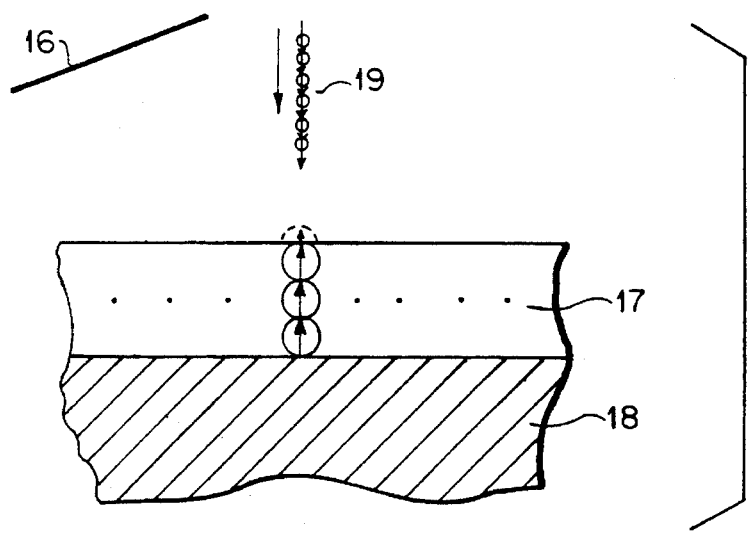
FIGS. 5(a)–5(b) are partial cross-sectional views of the data storage medium of FIG. 1 during a data store operation.
Figure 5B:
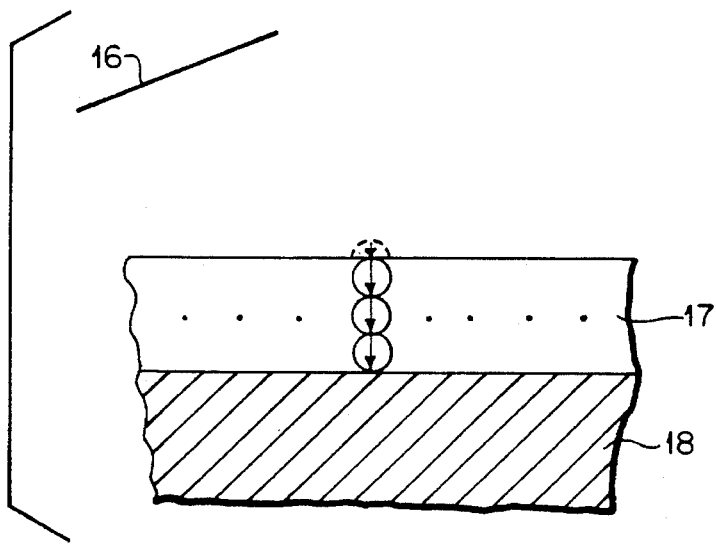

The storing of data in the data storage and retrieval device of FIG. 1 is accomplished as follows. First, the spin-polarized electron source 2a and tip 2b provide the spin-polarized electrons 3 with a direction of polarization corresponding to one of a first and second data value. Next, the extractor 4 extracts the spin-polarized electrons 3 from the tip 2b, the collimators 6, 7 and 9 collimate the spin-polarized electrons 3 into the spin-polarized electron beam 19, and the electrostatic lenses 10–12 focus the spin-polarized electron beam 19. As shown in FIG. 5(a), the spin-polarized electron beam 19 is directed by the microdeflectors 14 and 15 at a data magnetic field created in the data storage layer 17 at which data is to be stored. As shown in FIG. 5(b), upon striking the data magnetic field with sufficient energy, the spin-polarized electron beam 19 impinges the surface of the data storage layer 17 causing a cascading field reversal effect along the easy axis of magnetization producing the data magnetic field. As a result, the direction of polarization of the electrons in the spin-polarized electron beam 19 are imparted to the data magnetic field.

To achieve, the desired cascading field reversal effect, both the energy level of the spin-polarized electron beam 19 and the wavelength of the electrons in the spin-polarized electron beam 19 should be set in accordance with the material used for the data storage layer 17. In particular, the energy of the spin-polarized electron beam 19 should be approximately equal to the kinetic energy of the electrons in the d subshell of the atoms of the material used for the data storage layer 17 and the wavelength of the electrons in the spin-polarized electron beam 19 should be the de Broglie wavelength of the electrons in the d subshell of the atoms of the material used for the data storage layer 17.

Figure 3B:
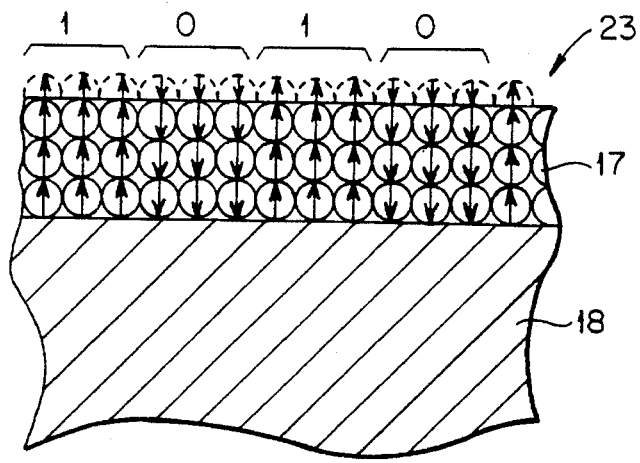

As explained above, it is contemplated that portions of the data storage layer 17 as small as one atom wide can represent a single data value. However, it is also contemplated that portions of the data storage layer 17 several atoms wide may also represent a single data value, as shown in FIG. 3(b). If the atoms in the data storage layer 17 are grouped as such, the diameter of the spin-polarized electron beam electron beam 19 should be made large enough to accommodate the larger data storage areas.

The reading of data from the data storage layer 17 can be accomplished using one of two techniques. In the first data reading technique, the spin-polarized electron source 2a and tip 2b provide the spin-polarized electrons 3 with a direction of polarization corresponding to one of a first and second data value. Next, the extractor 4 extracts the spin-polarized electrons 3 from the tip 2b, the collimators 6, 7 and 9 collimate the spin-polarized electrons 3 into the spin-polarized electron beam 19, and the electrostatic lenses 10–12 focus the spin-polarized electron beam 19. The spin-polarized electron beam 19 is then directed by the microdeflectors 14 and 15 at a portion of the data storage layer 17 from which data is to be read.

Figure 6A:
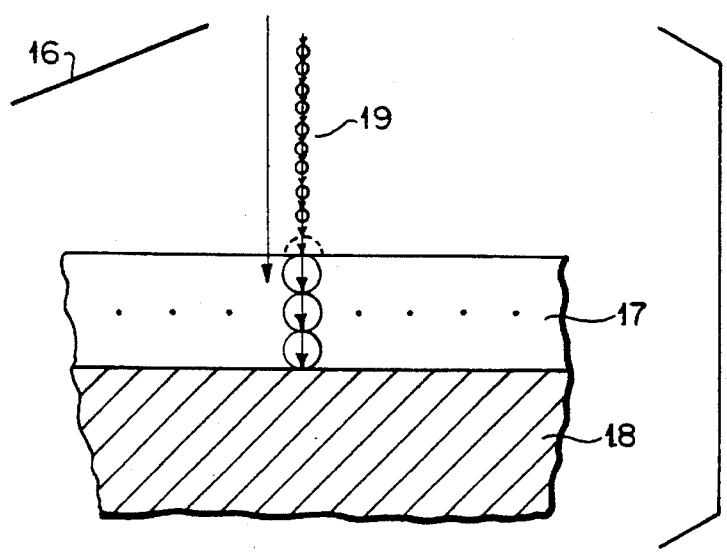
FIGS. 6(a)–6(b) are partial cross-sectional views of the data storage medium of FIG. 1 during a first data read operation.

As shown in FIG. 6(a), if the direction of polarization of the data magnetic field of the portion to be read is the same as the direction of polarization of the electrons in the spin-polarized electron beam 19, the electrons in the spin-polarized electron beam 19 are attracted by the data magnetic field and absorbed by the data storage layer 17. Absorption of the electrons by the data storage layer 17 results in the generation of a signal $S_{20}$.

Figure 6B:
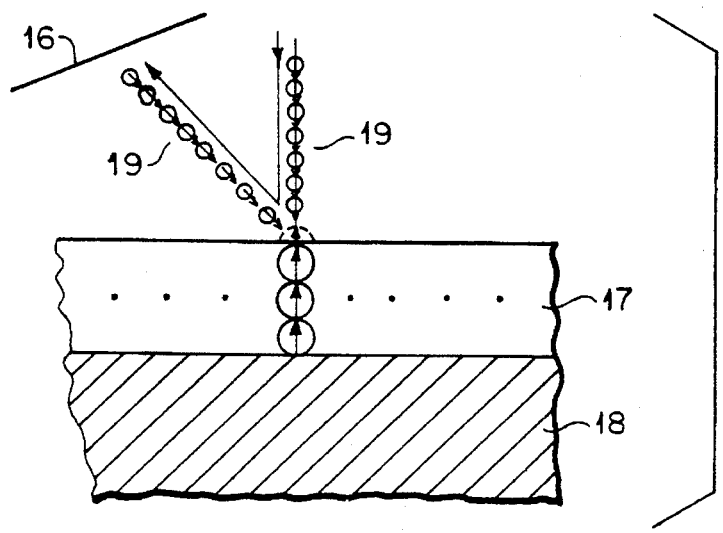

As shown in FIG. 6(b), if the direction of polarization of the data magnetic field is opposite the direction of polarization of the electrons in the spin-polarized electron beam 19, the electrons in the spin-polarized electron beam 19 are deflected by the data magnetic field and impinge upon the electron detector 16. As previously explained, impingement of the electrons upon the electron detector 16 results in the generation of the signal $S_{18}$.

Attraction of the electrons in the spin-polarized electron beam 19 by the data magnetic field is detected by the control unit 1 and interpreted as a first data value, e.g., a data value of "0", while deflection of the electrons in the spin-polarized electron beam 19 by the data magnetic field is detected by the control unit 1 and interpreted as a second data value, e.g., a data value of "1". Specifically, the control unit 1 detects and interprets the signal $S_{18}$, the signal $S_{20}$, or both the signal $S_{18}$ and the signal $S_{20}$ at a fixed time relative to the generation of the spin-polarized electrons 3 and, therefore, at a fixed time relative to the impact of the spin-polarized electron beam 19 with the data storage layer 17. If the signal $S_{18}$ is not detected and/or the signal $S_{20}$ is detected by the control unit 1 a specified time after the generation of the spin-polarized electrons 3, the control unit 1 determines that the electrons in the spin-polarized electron beam 19 have been attracted by the data magnetic field and absorbed by the data storage layer 17. On the other hand, if the signal $S_{18}$ is detected and/or the signal $S_{20}$ is not detected by the control unit 1 a specified time after the generation of the spin-polarized electrons 3, the control unit 1 determines that the electrons in the spin-polarized electron beam 19 have been deflected by the data magnetic field and detected by the electron detector 16. Preferably, excess electrons in the data storage layer 17 are drained, for example, at the electrode producing signal $S_{20}$ while excess electrons in the electron detector 16 are drained, for example, at the electrode producing the signal $S_{18}$.

As was the case when storing data, when reading data from the data storage layer 17 using the first technique, the energy level of the spin-polarized electron beam 19 should be set in accordance with the material used for the data storage layer 17. However, when reading data using the first technique, the energy level of the spin-polarized electron beam 19 should be low enough so as not to cause a magnetic change to the data magnetic fields created in the data storage layer 17.

In the second data reading technique, the spin-polarized electron source 2a and tip 2b provide the spin-polarized electrons 3 with a direction of polarization corresponding to one of a first and second data value. Next, the extractor 4 extracts the spin-polarized electrons 3 from the tip 2b, the collimators 6, 7 and 9 collimate the spin-polarized electrons 3 into the spin-polarized electron beam 19, and the electrostatic lenses 10–12 focus the spin-polarized electron beam 19. The spin-polarized electron beam 19 is then directed by the microdeflectors 14 and 15 at a portion of the data storage layer 17 from which data is to be read.

In this second technique, the energy of the spin-polarized electron beam 19 is at a value higher than that for a data store operation and high enough such that the spin-polarized electron beam 19 penetrates into the portion of the data storage layer 17 causing that portion of the data storage layer 17 to produce secondary electrons. Preferably, the energy of the spin-polarized electron beam 19 should not be so high as to cause thermal migration of the atoms in the lattices of the data storage 17.

The secondary electrons produced by the data storage layer 17 have specific energy and spin which are characteristic of the relationship between the direction of polarization of the data magnetic field generated by the portion of the data storage layer 17 and the direction of polarization of the electrons in the spin-polarized electron beam 19. These secondary electron characteristics are detected as one of the first and second data values.

Figure 7A:
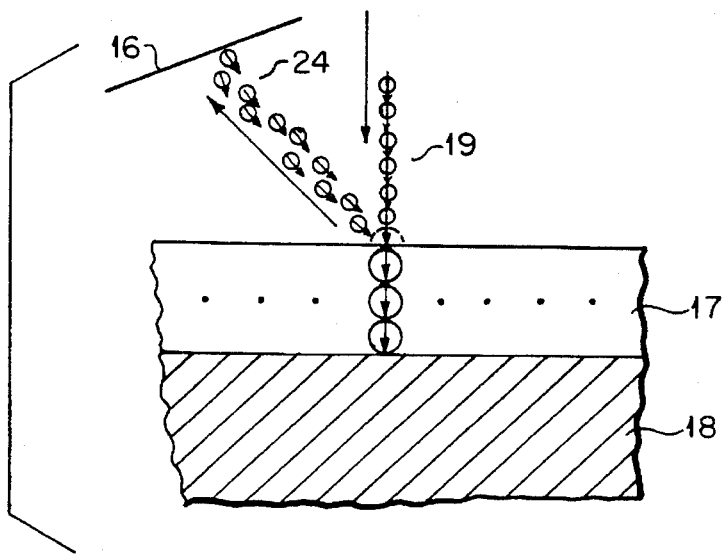
FIGS. 7(a)–7(b) are partial cross-sectional views of the data storage medium of FIG. 1 during a second data read operation.
Figure 7B:
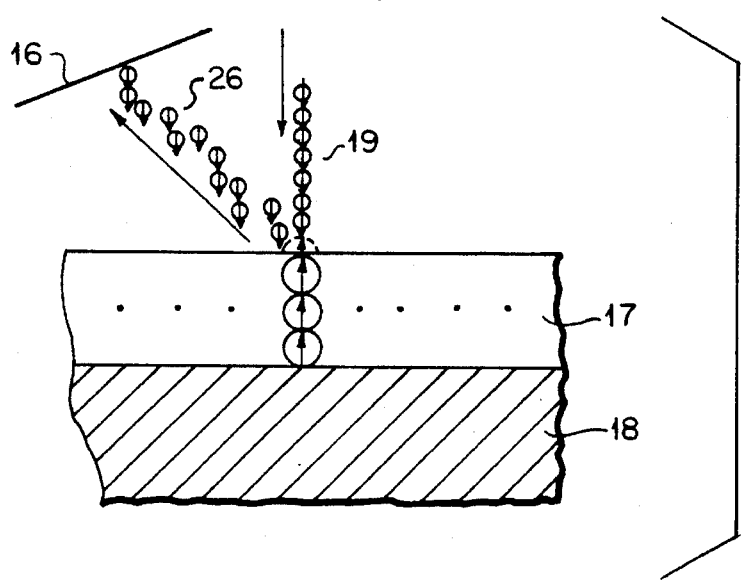

For example, as shown in FIG. 7(a), if the direction of polarization of the data magnetic field is the same as the direction of polarization of the electrons in the spin-polarized electron beam 19, the data storage layer 17 produces secondary electrons 24 having a first energy and first spin characteristics corresponding to the first data value, e.g., a data value of "1". Similarly, as shown in FIG. 7(b), if the direction of polarization of the data magnetic field is opposite the direction of polarization of the electrons in the spin-polarized electron beam 19, the data storage layer 17 produces secondary electrons 26 having a second energy and second spin characteristics corresponding to the second data value, e.g., a data value of "0". The secondary electrons produced by the data storage layer 17 are detected by the electron detector 16 to produce signal $S_{18}$ which indicates the secondary electron characteristics. The control unit 1, upon receiving the signal $S_{18}$, interprets the secondary electron characteristics.

Although this second technique has been described as detecting the energy and spin characteristics of the secondary electrons produced by the data storage layer 17, it is contemplated that other characteristics of the secondary electrons known in the art can be detected to read data stored on the data storage layer 17. Further, although most of the secondary electrons produced by the data storage layer 17 are emitted by the data storage layer 17, as shown in FIGS. 7(a) and 7(b), some of the secondary electrons remain within the data storage layer 17 to produce signal $S_{20}$. Thus, it is contemplated that the characteristics of the secondary electrons produced by the data storage layer 17 can also be detected and interpreted by the control unit 1 via signal $S_{20}$.

Figure 8:
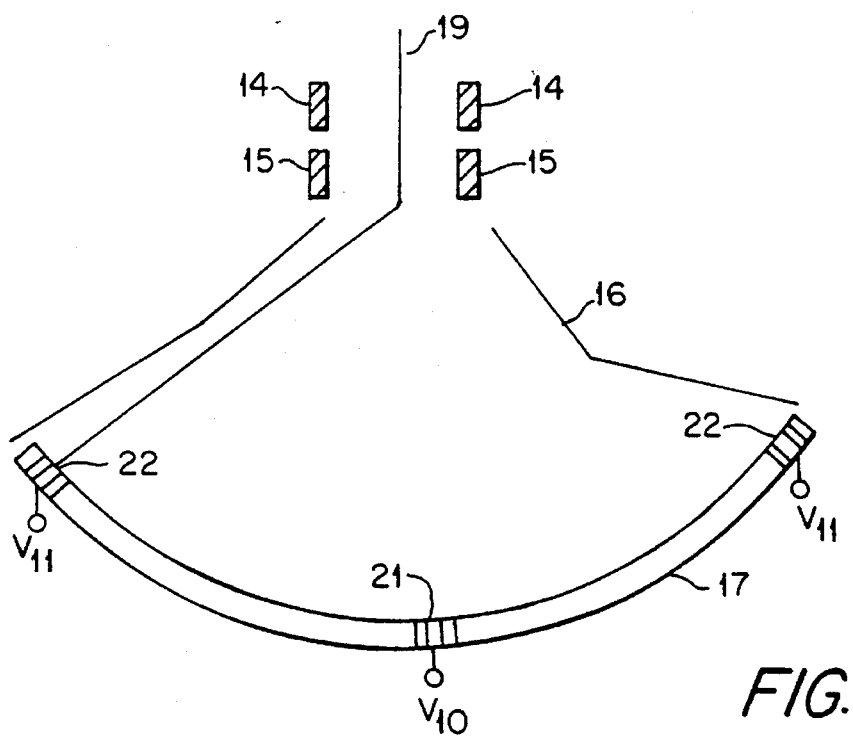
FIG. 8 is a partial cross-sectional view of the data storage and retrieval device of FIG. 1 during an alignment operation.

As shown in FIG. 8, alignment of the spin-polarized electron beam 19 is performed by directing the beam at one or more of the alignment areas 22. When the potential $V_{11}$ is detected by the control unit 1, the addressed and targeted alignment areas match. If the potential $V_{11}$ is not detected, signals $S_2$–$S_{17}$ to the microdeflectors 14 and 15 can be adjusted by the control unit 1 to compensate for any misalignment. Preferably, alignment of the spin-polarized electron beam 19 occurs periodically during operation of the device.

As described above, the blanking element 13, under control of the control unit 1, prevents the spin-polarized electron beam 19 from impinging on the data storage layer 17. The blanking element 13 comprises, for example, two poles controlled with signal $S_1$. It is contemplated that blanking element 13 can have other configurations known in the art and that the poles can be individually controlled. The control unit 1 applies the signal $S_1$ to the blanking element 13 at a specific time and for a specific duration to blank the spin-polarized electron beam 19 while signals $S_2$–$S_{17}$ to the microdeflectors 14 and 15 and settling to target a different portion of the data storage layer 17. The blanking element 13 can also be used to blank the spin-polarized electron beam 19 during a data read operation when the control unit 1 is detecting whether or not electrons are being deflected or emitted by the data storage layer 17. The poles of the blanking element 13 act to diffuse the spin-polarized electron beam 19 so the electrons in the beam do not impinge on the surface of the data storage layer 17.

Figure 9:
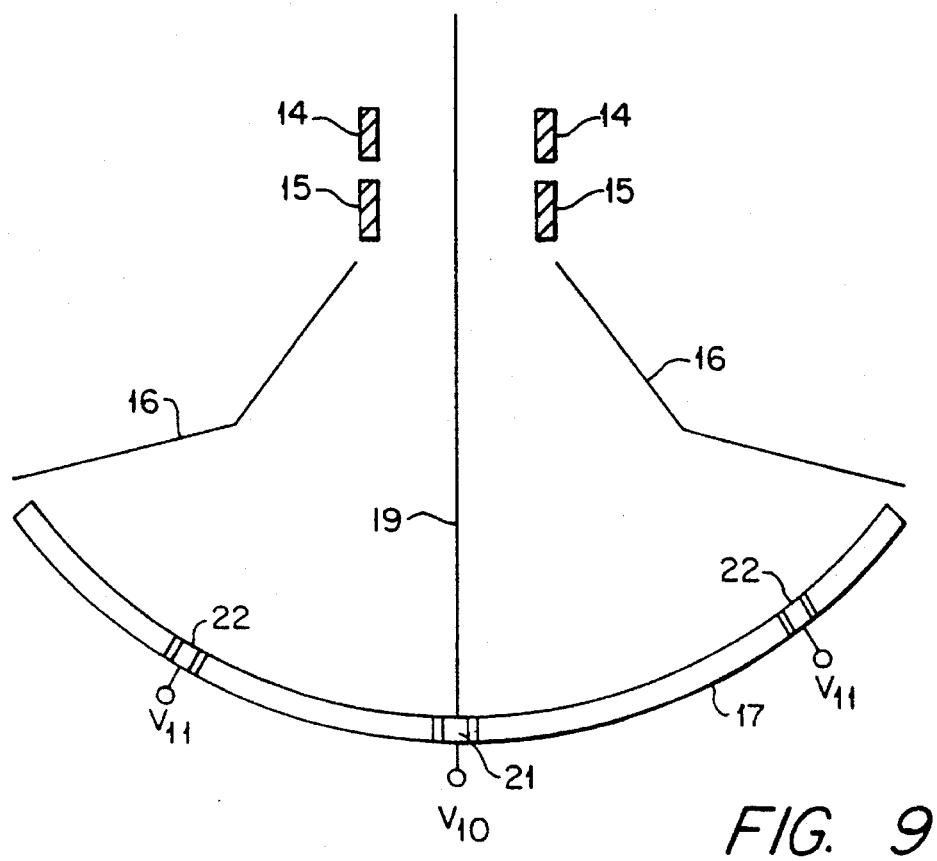
FIG. 9 is a partial cross-sectional view of the data storage and retrieval device of FIG. 1 during a blanking/parking operation.

It is contemplated that the microdeflectors 14 and 15 can alternatively be used to perform blanking of the spin-polarized electron beam 19 during data read operations. For example, the control unit 1 can supply the microdeflectors 14 and 15 with signals $S_2$–$S_{17}$ to cause the spin-polarized electron beam 19 to be directed at a particular area on the data storage layer 17 that is not used for data storage, e.g., parking area 21, as shown in FIG. 9. Impingement of the spin-polarized electron beam 19 on the parking area 21 is detected as the potential $V_{10}$ by the control unit 1.

Imperfections may exist in the data storage layer 17 as a result of fabrication, degradation, or other causes which render one or more flawed areas of the data storage layer 17 unusable for data storage. Accordingly, a format operation is provided to prevent the reading of data from and the storing of data to those flawed areas. For example, during the format operation, the control unit 1 cycles each data magnetic field created in the data storage layer 17 between up and down polarities at least once and verifies each result. This format operation can be performed, for example, by successively using the data read and data store operations described above. Control unit 1 determines whether certain portions of the data storage layer 17, from which written data cannot be reliably read, are unusable. Upon completion of the format operation, the locations of the unusable portions of the data storage layer 17 are stored in a memory which is maintained, for example, by the control unit 1 for use in determining where data can be stored during subsequent data storage operations.

It is contemplated that the format operation can detect and store locations of unusable portions of the data storage layer 17 during operation of the data storage and retrieval device. For example, after each store operation into a portion of the data storage layer 17, control unit 1 could then read from the portion, to verify that the portion is currently non-defective.

The control unit 1 can also use the memory to store locations of portions of the data storage layer 17 that are used for storing and protecting data which are read often but stored infrequently. Examples of this type of data stored in current storage mediums are configuration data and driver software stored in ROM. This type of data is stored in portions of the data storage layer 17 which are designated protected in the memory. As an additional precaution to preventing unintentional changes to protected data, certain portions of the data storage layer 17 can comprise an alternate material for data storage layer 17. This alternate material would require a different spin-polarized electron beam intensity for storing data than that required by unprotected data locations. Thus, both access to the control unit 1 memory and modification of the spin-polarized electron beam intensity would be required to change polarities of such protected data.

Finally, potentials $V_1$–$V_8$ and $V_{12}$–$V_{19}$ and signals $S_1$–$S_{17}$ preferably have adjustable bias components. These bias components are used to compensate for position misalignment, beam deformation, and correctable effects to the spin-polarized electron beam 19 caused by other elements. The bias component of an element modifies the effect of that element on the spin-polarized electron beam 19 by changing the intensity of the field within the aperture of the element. Preferably, bias adjustments are performed by the control unit 1 during operation of the device. They occur in a specific order when the read and write functions are unable to determine or modify the polarity of a data magnetic field created in the data storage layer 17. The amount of bias compensation for each element is determined by adjustments needed to re-focus the intensity, wavelength, and cross-section of the spin-polarized electron beam 19 on the data storage layer 17 so that a known data magnetic field can be modified and read.

It should be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A data storage medium, comprising:

a substrate;

a data storage layer formed on the substrate, the data storage layer including a fixed number of atomic layers of a magnetic material, the fixed number of atomic layers providing the data storage layer with a magnetic anisotropy perpendicular to a surface of the data storage layer; and a data magnetic field created in the data storage layer, the data magnetic field being polarized either in a first direction perpendicular to the surface of the data storage layer and corresponding to a first data value or in a second direction opposite the first direction and corresponding to a second data value.

2. An apparatus for storing data as a direction of polarization of a data magnetic field, comprising:

an electron source for providing a spin-polarized electron having an electron magnetic field, the electron magnetic field having a direction of polarization corresponding to one of first and second data values; and an electron deflector for directing the spin-polarized electron through an electrically nonconductive environment at the data magnetic field to impart the direction of polarization of the electron magnetic field to the data magnetic field.

3. The data storage device of claim 1, wherein the substrate comprises a non-magnetic and electrically nonconductive material.

4. The data storage device of claim 1, wherein the non-magnetic and electrically nonconductive material includes at least one of a glass, a ceramic, and a crystal structure.

5. The data storage device of claim 1, wherein the data storage layer comprises at least one metal from the three periodic table transition series.

6. The data storage device of claim 5, wherein the metal includes at least one of Co, Ni, Ir, and Mo.

7. The apparatus of claim 2, further comprising an extractor for extracting the spin-polarized electron from the electron source.

8. The apparatus of claim 2, wherein the electron source provides a plurality of spin-polarized electrons and wherein the electron deflector includes:

a collimator for collimating the plurality of spin-polarized electrons into a spin-polarized electron beam;

a focusing element for focusing the spin-polarized electron beam; and a deflecting element for directing the spin-polarized electron beam at the data magnetic field.

9. The apparatus of claim 8, wherein the collimator includes a first electrostatic lens, the focusing element includes a second electrostatic lens, and the deflecting element includes a microdeflector.

10. The apparatus of claim 2, further comprising a blanking element for disabling an effect of the spin-polarized electron.

11. The apparatus of claim 2, wherein the electrically non-conductive environment is a vacuum.

* * * * *